United States Patent [19]
Shimizu

[11] Patent Number: 5,816,477
[45] Date of Patent: Oct. 6, 1998

[54] WIRE BONDING APPARATUS AND METHOD

[75] Inventor: Yasuhiko Shimizu, Yokohama, Japan

[73] Assignee: Kabushiki Kaisha Toshiba, Kawasaki, Japan

[21] Appl. No.: 670,604

[22] Filed: Jun. 26, 1996

[30] Foreign Application Priority Data

Jun. 27, 1995 [JP] Japan .................................. 7-160543

[51] Int. Cl.[6] .................................................. H01L 21/60
[52] U.S. Cl. ................................ 228/102; 228/4.5; 228/9
[58] Field of Search ................................ 228/1.1, 4.5, 9, 228/102, 180.5

[56] References Cited

U.S. PATENT DOCUMENTS

| 5,121,870 | 6/1992 | Evans, Jr. et al. | 228/102 |
| 5,123,585 | 6/1992 | Terakado et al. | 228/102 |
| 5,145,099 | 9/1992 | Wood et al. | 228/9 |
| 5,474,224 | 12/1995 | Nishimaki et al. | 228/102 |
| 5,615,821 | 4/1997 | Sasano | 228/102 |

*Primary Examiner*—Kenneth J. Ramsey

*Attorney, Agent, or Firm*—Finnegan, Henderson, Farabow, Garrett & Dunner, L.L.P.

[57] ABSTRACT

A wire bonding apparatus comprises an X-Y table for placing thereon a die pad, on which a rectangular semiconductor chip with a plurality of first bonding pads is mounted, and a package component with a plurality of second bonding pads, a bonding tool for bonding, using a wire, each of the first bonding pads to a corresponding one of the second bonding pads, the bonding tool being movable between a reference position and a bonding level in a Z-direction, a camera system having an auto-focusing function for detecting the Z-directional position of each of the first and second bonding pads, thereby creating Z-directional data concerning the first and second bonding pads, a bonding level computer for calculating bonding levels of the bonding tool on the basis of the Z-directional position data, a bonding sequence computer for determining the motion sequence of the bonding tool on the basis of the calculated bonding levels, and a position/load control selector for selecting, on the basis of the determined motion sequence, a type of control of the bonding tool such that position control is performed while the tool is moved, and load control is performed while the tool performs bonding.

20 Claims, 2 Drawing Sheets

WIRE BONDING APPARATUS AND METHOD

BACKGROUND OF THE INVENTION

1. Field of the Invention

This invention relates to a wire bonding apparatus and a wire bonding method for manufacturing semiconductor devices, and more particularly to a bonding tool and a method for controlling the motion of an X-Y table.

2. Description of the Related Art

Wire bonding is known as a technique for electrically connecting a pad electrode of a semiconductor chip to a terminal electrode of a package component such as a lead frame. Wire bonding methods include a ball bonding method for bonding, to such a component, a gold ball formed at the tip of a gold wire by thermocompression bonding (in many cases, ultrasonic vibration is used in addition to heat); a wedge bonding method using a wedged tool for bonding the wire itself to the component by thermocompression bonding; and a ultrasonic bonding method using ultrasonic vibration. Among these bonding methods, the ball bonding method is broadly used in the field of integrated circuits since it is highly reliable and speedy. The integrated circuits have come to employ a great number of pins therein, which requires high-speed bonding. At present, the time required to bond a single wire with a length of 2 mm is approx. 0.12 sec. To more increase the bonding speed raises various problems relating to mechanical limitations, etc.

The conventional thermocompression bonding is performed in the well-known manner described below. In the example below, a metal thin wire made of e.g. gold is used to connect each pad electrode on a semiconductor chip mounted on the die pad of a lead frame, to the terminal electrode of a corresponding inner lead of the frame.

First, a bonding tool which holds a gold wire with a gold ball at its tip is moved to a position above a pad electrode. Thereafter, the following operations are performed successively:

(1) The tool is lowered to a search level at high speed.

(2) Then, the tool is lowered at low (constant) speed to a predetermined level at which bonding is performed (search step).

(3) The tool presses the ball against the pad electrode on the semiconductor chip, thereby performing pad-side bonding.

(4) The tool is raised, while the X-Y table with the lead frame mounted thereon is moved to a position in which the next bonding point (terminal electrode) is situated just below the tool. The tool is then lowered, thereby forming a loop of the bonding wire. The tool is lowered to the search level of the terminal electrode at high speed.

(5) Subsequently, the tool is lowered at low (constant) speed to a predetermined level at which bonding is performed (search step).

(6) The tool presses the wire against the terminal electrode, thereby performing lead-side bonding.

(7) The tool is raised to cut the wire.

(8) Another gold ball is formed for the next bonding.

(9) The tool is moved to the next bonding pad, which is the termination of one sequence of bonding.

The vertical (Z-directional) motion of the tool is controlled by position control in the high-speed lowering step (1) and in the low(constant)-speed lowering step (search step) (2). In the chip-side bonding step (3), it is detected whether or not the bonding pad surface is touched by the tool, and then the position control is switched to load control. After the chip-side bonding, the load control is switched to the position control, thereby executing the loop-forming step (4) and the low-speed lowering step (search step) (5). Also in the terminal electrode-side bonding step (6), after the tool is detected to have touched the surface of the terminal electrode, the position control is switched to the load control. After the terminal electrode-side bonding, the load control is switched to the position control, thereby executing the tool-raising step (7) for wire cutting, the ball-forming step (8) and the step (9) of moving the tool to the next pad.

As described above, in the conventional Z-directional motion of the tool, a search level is set on the way of the Z-directional lowering path, in light of variations in level among the bonding surfaces (electrode surfaces) of the semiconductor chip and the inner lead. When the tool has reached the search level, the lowering speed is shifted from high speed to low speed so as to weaken the shock of the tool against the semiconductor chip.

To this end, a certain period of time is necessary in the low(constant)-speed lowering step (2). The speed during the low-speed lowering serves as an impact load at the time of bonding and is considered important as a bonding condition. This speed is not set to a constant value, but is varied case by case (device to device). Accordingly, the time required for low-speed lowering of the tool in the step (2) varies among cases, which inevitably varies the cycle of bonding.

Moreover, since the position control is switched to the load control after the tool is detected to have touched the bonding surface, there is a delay (i.e. loss of time) between a point of time at which the tool has touched the bonding surface, and a point of time at which a load is applied thereto.

SUMMARY OF THE INVENTION

It is the object of the invention to provide a bonding method for saving a wasteful operation time and shortening the bonding cycle time, and a bonding apparatus which employs the bonding method.

According to an aspect of the invention, there is provided a wire bonding apparatus comprising:

an X-Y table for placing thereon a die pad, on which a rectangular semiconductor chip with a plurality of first bonding pads is mounted, and a package component with a plurality of second bonding pads, the semiconductor chip being horizontally held above the X-Y table, and the X-Y table being movable in both X- and Y-directions;

a bonding tool for bonding, using a wire, each of the first bonding pads to a corresponding one of the second bonding pads, the bonding tool being movable between a reference position and a bonding level in a Z-direction perpendicular to the X-Y table;

a camera system having an auto-focusing function for detecting the Z-directional position of each of the first and second bonding pads, thereby creating Z-directional data concerning the first and second bonding pads;

a bonding level computer for calculating bonding levels of the bonding tool on the basis of the Z-directional position data concerning the first and second bonding pads;

a bonding sequence computer for determining the motion sequence of the bonding tool on the basis of the calculated bonding levels; and a position/load control selector for selecting, on the basis of the determined motion sequence, a type of control of the bonding tool such that position control is performed while the tool is moved, and load control is performed while the tool performs bonding. Preferably, the camera system further obtains data concerning the horizontal position of each of the first bonding pads of the horizontally held semiconductor chip, and data concerning the horizontal position of each of the second bonding pads of the package component.

More preferably, the bonding level computer calculates the distance which the bonding tool covers from the reference position, on the basis of the created data concerning the Z-directional positions of the first and second bonding pads, thereby calculating the bonding level.

Also preferably, the bonding sequence computer obtains data concerning the horizontal positions of those two of the first bonding pads which are opposed to each other on a diagonal line, and then corrects prestored position data concerning the first bonding pads, on the basis of the obtained data.

Preferably, the bonding sequence computer calculates the horizontal motion sequence of the X-Y table on the basis of the corrected data concerning the first bonding pads.

More preferably, the bonding sequence computer obtains data concerning the horizontal positions of those two of the second bonding pads of the package component, which are remotest from each other, and then corrects prestored data concerning the positions of the second bonding pads, on the basis of the obtained data.

Yet preferably, the position/load control selector decelerates a speed of motion of the bonding tool in an initial stage and a final stage of the motion of the tool.

Preferably, the position/load control selector outputs, at the time of performing the load control, load data for coupling the wire with the first and second bonding pads by compression bonding.

The bonding apparatus, preferably, further comprises X- and Y-directional motors for moving the X-Y table in the X- and Y-directions, respectively, and X- and Y-driving apparatuses for driving the X- and Y-directional motors, respectively.

Preferably, the bonding apparatus further comprises a Z-directional motor for moving the bonding tool in the Z-direction, and a Z-directional driving apparatus for driving the Z-directional motor.

According to another aspect of the invention, there is provided a wire bonding method comprising:

the step of placing, on an X-Y table employed in a wire bonding apparatus, a die pad on which a rectangular semiconductor chip with a plurality of first bonding pads is mounted and a package component with a plurality of second bonding pads;

the step of detecting the vertical position of each first bonding pad of the semiconductor chip horizontally held on the die pad by means of a camera with an auto-focusing function, thereby obtaining first vertical position data;

the step of lowering a bonding tool with a bonding wire, to the first bonding pad of the semiconductor chip at a predetermined speed by position control based on the first vertical position data;

the step of switching control from the position control to load control after the bonding tool reaches the first bonding pad, thereby bonding the bonding wire to the first bonding pad;

the step of switching again the control from the load control to the position control to raise the bonding tool;

the step of moving the bonding tool above a corresponding one of the second bonding pads of the package component;

the step of detecting the vertical positions of the second bonding pads by means of the camera with the auto-focusing function, and obtaining second vertical position data;

the step of lowering at the predetermined speed the bonding tool with the bonding wire to the corresponding one of the second bonding pads on the basis of the second vertical position data; and the step of switching the control from the position control to the load control after the bonding tool reaches the corresponding one of the second bonding pads, thereby bonding the bonding wire to the corresponding one of the second bonding pads.

Preferably, the step of obtaining the first vertical position data includes the step of obtaining data concerning the horizontal positions of the first bonding pads of the semiconductor chip, in addition to the vertical position data.

Further preferably, the step of lowering the bonding tool at the predetermined speed to each of the first bonding pads includes the step of decelerating the predetermined speed in an initial stage and a final stage of a lowering motion.

Yet preferably, the step of switching the control of the bonding tool to the position control and raising the tool at the predetermined speed includes the step of decelerating the predetermined speed in an initial stage and a final stage of a raising motion.

Also preferably, the step of obtaining the second vertical position data includes the step of obtaining data concerning the horizontal positions of the second bonding pads of the package component, in addition to the vertical position data.

Preferably, the step of lowering the bonding tool at the predetermined speed to the corresponding one of the second bonding pads includes the step of decelerating the predetermined speed in an initial stage and a final stage of a lowering motion.

More preferably, the step of obtaining the horizontal position data concerning the first bonding pads includes the step of obtaining position data concerning those two of the first bonding pads which are opposed to each other on a diagonal line, thereby correcting prestored position data concerning the first bonding pads.

Preferably, the step of obtaining the horizontal position data concerning the second bonding pads includes the step of obtaining data concerning the horizontal positions of those two of the second bonding pads of the package component, which are remotest from each other, thereby correcting prestored data concerning the positions of the second bonding pads.

Yet preferably, the X-Y table covers a desired distance on the basis of the horizontal position data obtained in the step of obtaining the horizontal position data concerning the first bonding pads.

Also preferably, the X-Y table covers a desired distance on the basis of the horizontal position data obtained in the step of obtaining the horizontal position data concerning the second bonding pads.

In the bonding method of the invention, the level of the surface of a semiconductor chip and that of the lead surface of a package component are detected by the auto-focusing function of a camera system, which enables a bonding tool to be directly lowered to a bonding pad surface at high speed without the conventional lowering-speed change after search-level setting. Thus, the invention is free from time loss due to low-speed searching of the bonding pad surface, and hence can perform bonding at high speed.

The invention is also free from time loss, before the load control, due to determination as to whether or not the tool has touched the bonding pad surface. As a result, the bonding speed of the invention is further improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DETAILED DESCRIPTION OF THE PREFERRED EMBODIMENT

The embodiment of the invention will be described with reference to the accompanying drawings.

Figure 1:
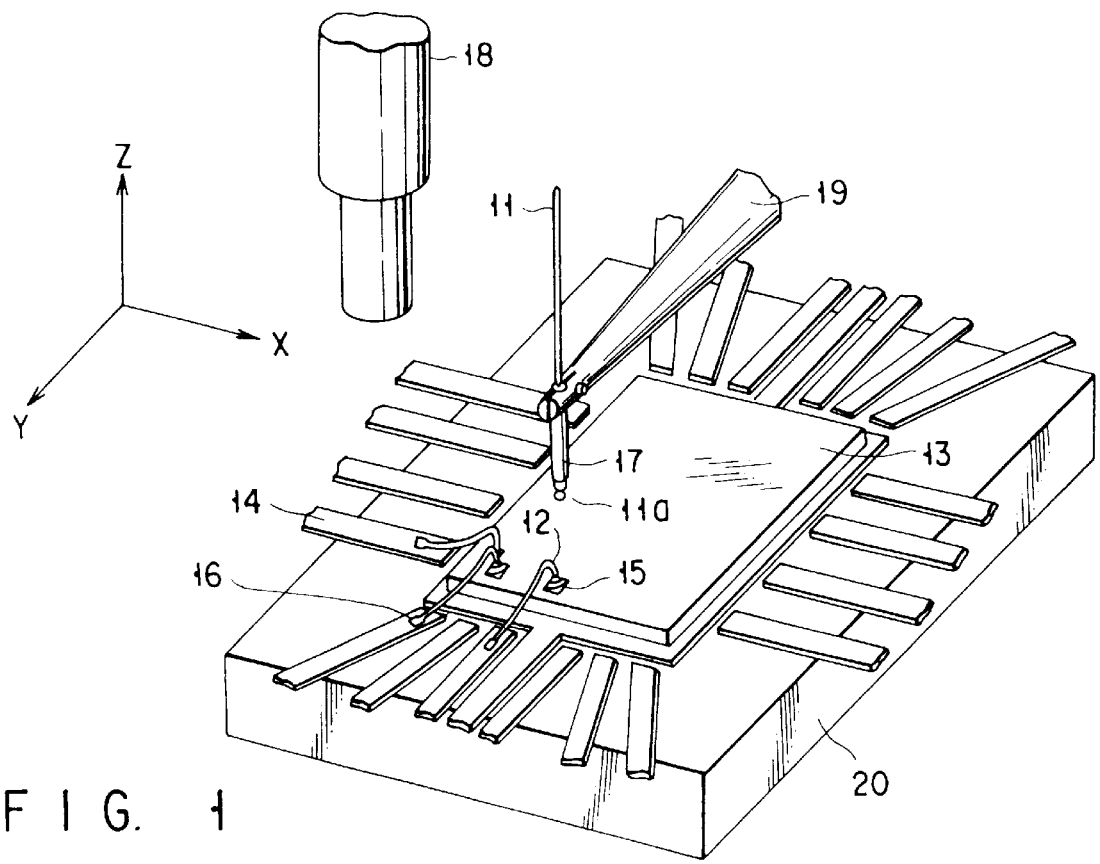
FIG. 1 is a perspective view, showing a bonding tool and its peripheral components,in a bonde employed in a bonding apparatus according to the embodiment of the invention.
Figure 2:
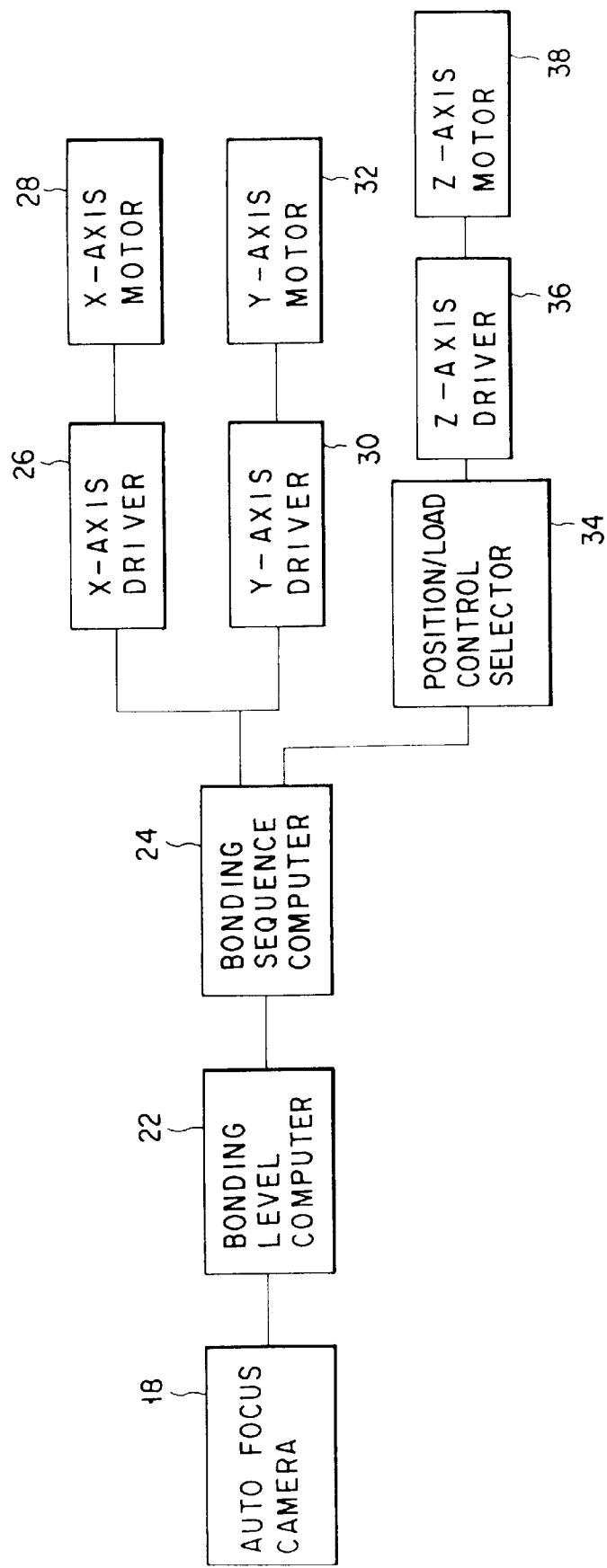
FIG. 2 is a block diagram, showing a control system employed in the bonding apparatus of FIG. 1.

FIG. 1 is a perspective view, showing an essential part of a bonding apparatus according to the embodiment of the invention, and useful in explaining the manner of wire bonding. Reference signs X, Y and Z in FIG. 1 denote axes of coordinates. FIG. 2 is a block diagram, showing a control system incorporated in the bonding apparatus of the invention. Since an internal structure of each of the blocks shown in FIG. 2 is well known to persons skilled in the art, a detailed description will be omitted.

First, a camera 18 with an auto-focusing function recognizes the two-dimensional position of each bonding pad (pad electrode) 15 on a semiconductor chip 13, thereby detecting a displacement of the pad from a reference position. This detection is performed by usually determining the positions of two pads arranged on a diagonal line. Upon detection of the displacement, position data prestored in the apparatus for the motion control of an X-Y table 20 is updated.

The above-described detection operation is not peculiar to the present invention. The present invention is characterized in that the Z-directional level of the surface of the bonding pad from a reference position is detected, and the bonding level is calculated by a bonding level computer 22. Specifically, the distance which a bonding tool 17 has covered from a reference position (its waiting position) is calculated.

Thereafter, the two-dimensional position of each bonding pad 16 on a lead frame 14 is recognized by the camera, thereby correcting the reference data. At this time, the Z-directional level of the bonding pad 16 is also read by the auto-focusing function of the camera. At the time of determining the two-dimensional position of the bonding pad 16, the two-dimensional positions of two pads 16 remotest from each other may be detected, thereby correcting the prestored the position data concerning the lead frame 14 using the detected positions.

The driving amounts in the X- and Y-directions are calculated by a bonding sequence computer 24 on the basis of prestored operation data for determining the operation of the motion mechanism. On the basis of the calculation results, an X-axis motor 28 and a Y-axis motor 32 are driven via an X-axis driver 26 and a Y-axis driver 30, respectively. Concerning the Z-axis, position control and load control are shifted from one to the other by means of a position/load control selector 34, thereby performing Z-directional driving control via a Z-axis driver 36 and a Z-axis motor 38.

Figure 3:
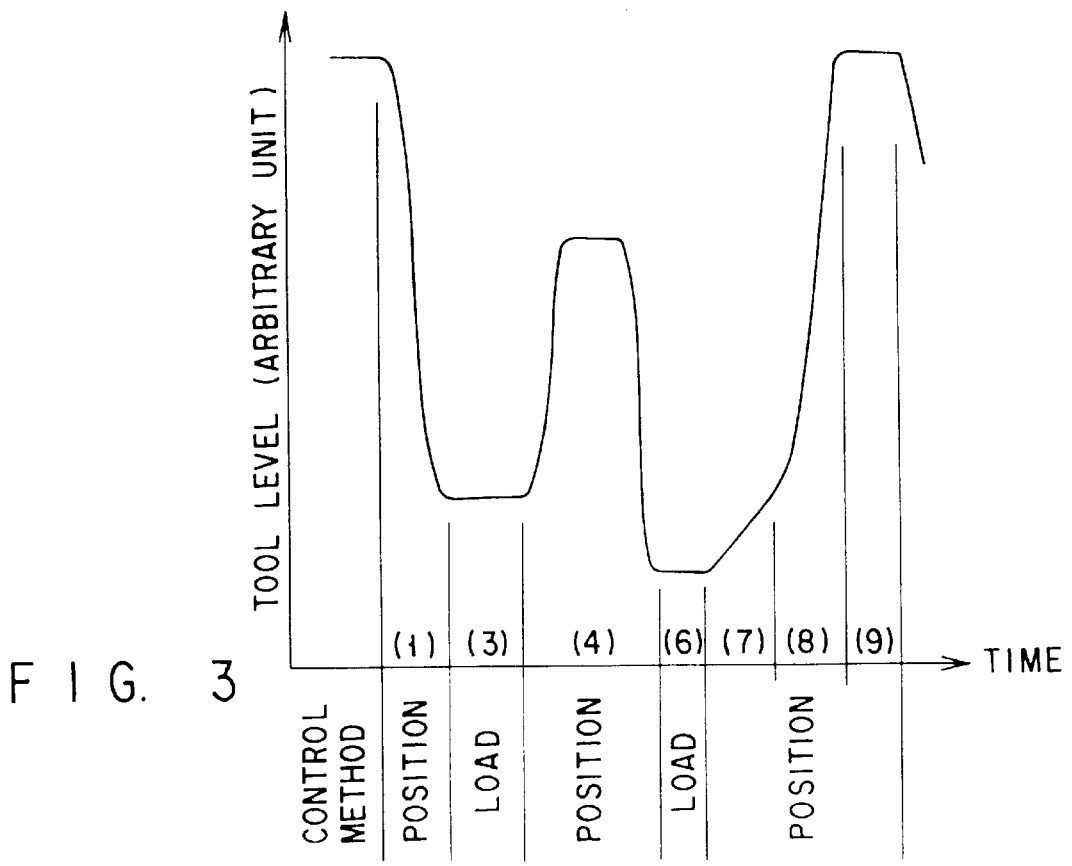
FIG. 3 is a view, useful in explaining a sequence of Z-directional operations of the bonding tool employed in the bonding apparatus of FIG. 1.

FIG. 3 shows an operation sequence indicative of Z-directional operations and switching of control methods employed in the present invention. The ordinate indicates Z-directional relative positions. Numerals along the abscissa indicate operation stages, and correspond to the sequence numerals of the conventional operation stages described in the Section "Description of the Related Art", thereby facilitating the understanding of the present invention.

Bonding is performed in the manner described below.

After the wire held by the tool and having the gold ball formed at its tip is moved to a position above the bonding pad 15:

(1) The tool is lowered at high speed to the level of that bonding surface of the semiconductor chip, which is beforehand detected by the camera 18.

(3) (Without the conventional step (2)) Bonding is performed on the side of the bonding pad 15 of the semiconductor chip 13.

(4) After the bonding, the tool is raised, and the X-Y table with the semiconductor chip 13 mounted thereon is moved to a position where the next bonding point (i.e. the bonding pad 16 of an inner lead) is situated just below the tool, thereby forming a loop of the bonding wire.

(6) (Without the conventional step (5)) After the tool reaches the bonding pad 16 of the inner lead, the inner-side bonding is performed.

(7) The tool is raised to cut the wire.

(8) Another gold ball is formed for the next bonding.

(9) The tool is moved to the next bonding pad, which is the termination of one sequence of bonding.

The vertical (Z-directional) motion of the tool is controlled by position control in the high-speed lowering step (1). In the bonding step (3) on the side of the pad (15), the position control is switched to load control. The load control is performed to apply a load necessary to appropriately bond the bonding wire to the bonding pad. After the pad-side bonding, the load control is switched to the position control, thereby executing the loop-forming step (4). In the inner-lead-side bonding step (6), the position control is switched to the load control. After the inner-leadside bonding, the load control is switched to the position control, thereby executing the tool-raising step (7) for wire cutting, the ball-forming step (8) and the step (9) of moving the tool to the next pad.

Actually, the tool motion is decelerated in the initial stage and in the final stage of the motion, which means that the tool is smoothly moved along a so-called cycloidal curve.

The invention constructed as above can dispense with the conventional search steps (2) and (5) of lowering the tool at low speed. Furthermore, the invention is free from time loss due to determination as to whether or not the tool has touched the semiconductor chip surface and the lead surface. Typically, the time necessary in each search step is about 6 msec and the time loss for touch sensing is 3 msec each. This means that in the case of wire bonding with a cycle of 120 msec., the cycle is reduced by about 15%.

Although the above embodiment has taken the ball bonding as an example, it is a matter of course that the invention is also applicable to other bonding methods.

Moreover, although the embodiment has taken, as an example, a semiconductor chip mounted on a lead frame, it is a matter of course that the invention is also applicable to bonding between a lead electrode, printed on a package such as a ceramic package, and a pad electrode of a semiconductor chip.

The invention can eliminate time loss due to low-speed motion of the tool for searching the bonding surface and due to determination as to whether or not the tool has touched the bonding surface.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A wire bonding apparatus comprising:
   an X-Y table for placing thereon a die pad, on which a rectangular semiconductor chip with a plurality of first bonding pads is mounted, and a package component with a plurality of second bonding pads, the semiconductor chip being horizontally held above the X-Y table, and the X-Y table being movable in both X- and Y-directions;
   a bonding tool for bonding, using a wire, each of the first bonding pads to a corresponding one of the second bonding pads, the bonding tool being movable between a reference position and a bonding level in a Z-direction perpendicular to the X-Y table;
   a camera system having an auto-focusing function for detecting the Z-directional position of each of the first and second bonding pads, thereby creating Z-directional data concerning the first and second bonding pads;
   a bonding level computer for calculating bonding levels of the bonding tool on the basis of the Z-directional position data concerning the first and second bonding pads;
   a bonding sequence computer for determining the motion sequence of the bonding tool on the basis of the calculated bonding levels; and
   a position/load control selector for selecting, on the basis of the determined motion sequence, a type of control of the bonding tool such that position control is performed while the tool is moved, and load control is performed while the tool performs bonding.

2. The wire bonding apparatus according to claim 1, wherein the camera system further obtains data concerning the horizontal position of each of the first bonding pads of the horizontally held semiconductor chip, and data concerning the horizontal position of each of the second bonding pads of the package component.

3. The wire bonding apparatus according to claim 2, wherein the bonding sequence computer obtains data concerning the horizontal positions of those two of the first bonding pads which are opposed to each other on a diagonal line, and then corrects prestored position data concerning the first bonding pads, on the basis of the obtained data.

4. The wire bonding apparatus according to claim 3, wherein the bonding sequence computer calculates the horizontal motion sequence of the X-Y table on the basis of the corrected data concerning the first bonding pads.

5. The wire bonding apparatus according to claim 2, wherein the bonding sequence computer obtains data concerning the horizontal positions of those two of the second bonding pads of the package component, which are remotest from each other, and then corrects prestored data concerning the positions of the second bonding pads, on the basis of the obtained data.

6. The wire bonding apparatus according to claim 1, wherein the bonding level computer calculates the distance which the bonding tool covers from the reference position, on the basis of the created data concerning the Z-directional positions of the first and second bonding pads, thereby calculating the bonding level.

7. The wire bonding apparatus according to claim 1, wherein the position/load control selector decelerates a speed of motion of the bonding tool in an initial stage and a final stage of the motion of the tool.

8. The wire bonding apparatus according to claim 1, wherein the position/load control selector outputs, at the time of performing the load control, load data for coupling the wire with the first and second bonding pads by compression bonding.

9. The wire bonding apparatus according to claim 1, further comprising X- and Y-directional motors for moving the X-Y table in the X- and Y-directions, respectively, and X- and Y-driving apparatuses for driving the X- and Y-directional motors, respectively.

10. The wire bonding apparatus according to claim 1, further comprising a Z-directional motor for moving the bonding tool in the Z-direction, and a Z-directional driving apparatus for driving the Z-directional motor.

11. A wire bonding method comprising:
   the step of placing, on an X-Y table employed in a wire bonding apparatus, a die pad on which a rectangular semiconductor chip with a plurality of first bonding pads is mounted and a package component with a plurality of second bonding pads;
   the step of detecting the vertical position of each first bonding pad of the semiconductor chip horizontally held on the die pad by means of a camera with an auto-focusing function, thereby obtaining first vertical position data;
   the step of lowering a bonding tool with a bonding wire, to the first bonding pad of the semiconductor chip at a predetermined speed by position control based on the first vertical position data;
   the step of switching control from the position control to load control after the bonding tool reaches the first bonding pad, thereby bonding the bonding wire to the first bonding pad;
   the step of switching again the control from the load control to the position control to raise the bonding tool;
   the step of moving the bonding tool above a corresponding one of the second bonding pads of the package component;
   the step of detecting the vertical positions of the second bonding pads by means of the camera with the auto-focusing function, and obtaining second vertical position data;

the step of lowering at the predetermined speed the bonding tool with the bonding wire to the corresponding one of the second bonding pads on the basis of the second vertical position data; and the step of switching the control from the position control to the load control after the bonding tool reaches the corresponding one of the second bonding pads, thereby bonding the bonding wire to the corresponding one of the second bonding pads.

12. The wire bonding method according to claim 11, wherein the step of lowering the bonding tool at the predetermined speed to the corresponding one of the second bonding pads includes the step of decelerating the predetermined speed in an initial stage and a final stage of a lowering motion.

13. The wire bonding method according to claim 11, wherein the step of lowering the bonding tool at the predetermined speed to each of the first bonding pads includes the step of decelerating the predetermined speed in an initial stage and a final stage of a lowering motion.

14. The wire bonding method according to claim 11, wherein the step of switching the control of the bonding tool to the position control and raising the tool at the predetermined speed includes the step of decelerating the predetermined speed in an initial stage and a final stage of a raising motion.

15. The wire bonding method according to claim 11, wherein the step of obtaining the second vertical position data includes the step of obtaining data concerning the horizontal positions of the second bonding pads of the package component, in addition to the vertical position data.

16. The wire bonding method according to claim 15, wherein the step of obtaining the horizontal position data concerning the second bonding pads includes the step of obtaining data concerning the horizontal positions of those two of the second bonding pads of the package component, which are remotest from each other, thereby correcting prestored data concerning the positions of the second bonding pads.

17. The wire bonding method according to claim 15, wherein the X-Y table covers a desired distance on the basis of the horizontal position data obtained in the step of obtaining the horizontal position data concerning the second bonding pads.

18. The wire bonding method according to claim 11, wherein the step of obtaining the first vertical position data includes the step of obtaining data concerning the horizontal positions of the first bonding pads of the semiconductor chip, in addition to the vertical position data.

19. The wire bonding method according to claim 18, wherein the step of obtaining the horizontal position data concerning the first bonding pads includes the step of obtaining position data concerning those two of the first bonding pads which are opposed to each other on a diagonal line, thereby correcting prestored position data concerning the first bonding pads.

20. The wire bonding method according to claim 18, wherein the X-Y table covers a desired distance on the basis of the horizontal position data obtained in the step of obtaining the horizontal position data concerning the first bonding pads.

* * * * *